United States Patent
Ohta et al.

(10) Patent No.: US 10,770,641 B2
(45) Date of Patent: Sep. 8, 2020

(54) PIEZOELECTRIC ELEMENT

(71) Applicant: TDK CORPORATION, Tokyo (JP)

(72) Inventors: Yoshiki Ohta, Tokyo (JP); Hideya Sakamoto, Tokyo (JP); Kazushi Tachimoto, Tokyo (JP); Nobuo Furukawa, Tokyo (JP); Akihiro Takeda, Tokyo (JP)

(73) Assignee: TDK CORPORATION, Tokyo (JP)

( * ) Notice: Subject to any disclaimer, the term of this patent is extended or adjusted under 35 U.S.C. 154(b) by 316 days.

(21) Appl. No.: 15/720,288

(22) Filed: Sep. 29, 2017

(65) Prior Publication Data

US 2018/0090667 A1 Mar. 29, 2018

(30) Foreign Application Priority Data

Sep. 29, 2016 (JP) ................................. 2016-191737

(51) Int. Cl.
| | | |
|---|---|---|
| *H01L 41/04* | (2006.01) | |
| *H01L 41/187* | (2006.01) | |
| *H01L 41/083* | (2006.01) | |
| *H01L 41/047* | (2006.01) | |
| *H01L 41/09* | (2006.01) | |

(52) U.S. Cl.
CPC ...... *H01L 41/0838* (2013.01); *H01L 41/0471* (2013.01); *H01L 41/0474* (2013.01); *H01L 41/0477* (2013.01); *H01L 41/096* (2013.01); *H01L 41/1871* (2013.01); *H01L 41/1873* (2013.01); *H01L 41/1875* (2013.01); *H01L 41/1876* (2013.01); *H01L 41/1878* (2013.01)

(58) Field of Classification Search
CPC ............. H01L 41/0838; H01L 41/0471; H01L 41/0474; H01L 41/0477
USPC .......................... 310/322, 328, 334, 365, 366
See application file for complete search history.

(56) References Cited

U.S. PATENT DOCUMENTS

| | | | |
|---|---|---|---|
| 5,381,385 A * | 1/1995 | Greenstein | ............. B06B 1/064 310/334 |
| 2002/0113847 A1 | 8/2002 | Takagi et al. | |
| 2005/0156489 A1 | 7/2005 | Sasaki | |
| 2005/0253488 A1 | 11/2005 | Ito | |
| 2005/0274543 A1* | 12/2005 | Sasaki | ................. H01L 41/0474 174/255 |

FOREIGN PATENT DOCUMENTS

| | | |
|---|---|---|
| EP | 1710849 A2 | 10/2006 |
| JP | 2005-322850 A | 11/2005 |
| JP | 2005-340388 A | 12/2005 |
| JP | 5298999 B2 | 9/2013 |
| JP | 2016-051894 A | 4/2016 |

* cited by examiner

*Primary Examiner* — Derek J Rosenau
(74) *Attorney, Agent, or Firm* — Oliff PLC

(57) ABSTRACT

A piezoelectric element includes first and second electrodes, a first piezoelectric body layer, and a plurality of first through-hole conductors. The first and second electrodes oppose each other. The first piezoelectric body layer is disposed between the first electrode and the second electrode. The plurality of first through-hole conductors penetrates the first piezoelectric body layer and is connected to the first electrode and the second electrode. When seen in an opposing direction of the first and second electrodes, the plurality of first through-hole conductors is arrayed in a matrix.

10 Claims, 12 Drawing Sheets

PIEZOELECTRIC ELEMENT

TECHNICAL FIELD

One aspect of the present invention relates to a piezoelectric element.

BACKGROUND

For example, a piezoelectric element including a plurality of electrode layers and a piezoelectric body layer placed between the electrode layers is described in Japanese Unexamined Patent Publication No. 2016-51894. Each electrode layer includes a main electrode and a connection electrode having different polarities from each other in this piezoelectric element. A main electrode and a connection electrode in electrode layers next to each other are electrically connected to each other by a via that penetrates a piezoelectric body layer. This piezoelectric element is driven when a region placed between main electrodes in a piezoelectric body layer becomes an active region, which is piezoelectrically active, and displacement is generated in the active region.

SUMMARY

In the above-described piezoelectric element, it is considered, for example, to make a piezoelectric body layer multi-layered in order to improve a displacement amount. Also, it is considered, for example, to increase an area of a piezoelectric body layer in order to transmit driving force to a large area. In either case, capacitance of a piezoelectric element is increased. When capacitance of a piezoelectric element is increased, an amount of charge accumulated in the piezoelectric element is increased. As a result, current flowing in the piezoelectric element is increased. Thus, it is necessary to change a via conductor, which is provided in a via, in response to an increase in the current. For example, when a diameter of the via conductor becomes large, a contraction rate of the via conductor in firing becomes high. Thus, there is a possibility that breaking of the via conductor is generated. Thus, it is considered to increase the number of via conductors. However, when the number of via conductors is increased, cracks become likely to be extended along a sequence of the via conductors. Thus, there is a possibility that strength of a piezoelectric element is decreased.

One aspect of the present invention is to provide a piezoelectric element that can control a decrease in strength.

A piezoelectric element according to one aspect of the present invention includes first and second electrodes, a first piezoelectric body layer, and a plurality of first through-hole conductors. The first and second electrodes oppose each other. The first piezoelectric body layer is disposed between the first electrode and the second electrode. The plurality of first through-hole conductors penetrates the first piezoelectric body layer and is connected to the first electrode and the second electrode. When seen in an opposing direction of the first and second electrodes, the plurality of first through-hole conductors is arrayed in a matrix.

In the piezoelectric element according to the one aspect of the present invention, the plurality of first through-hole conductors is arrayed in a matrix. Thus, for example, compared to a case where a plurality of first through-hole conductors is arrayed in a line, cracks is controlled so as not to be extended along a sequence of the first through-hole conductors. Accordingly, it becomes possible to control a decrease in strength.

The piezoelectric element according to the one aspect of the present invention may include a second piezoelectric body layer, a third electrode, and a plurality of second through-hole conductors. The second piezoelectric body layer may oppose the first piezoelectric body layer via the second electrode. The third electrode may oppose the second electrode via the second piezoelectric body layer. The plurality of second through-hole conductors may penetrate the second piezoelectric body layer and may be connected to the second electrode and the third electrode. When seen in the opposing direction, the plurality of first through-hole conductors and the plurality of second through-hole conductors may be disposed in such a way as to be separated from each other. In this case, the first through-hole conductors and the second through-hole conductors are separated from each other and are not overlapped with each other when seen in the opposing direction. Thus, even when the first through-hole conductors and the second through-hole conductors contract in firing, it is possible to control generation of conduction failure such as breaking in the first through-hole conductors and the second through-hole conductors compared to a case where the first through-hole conductors and the second through-hole conductor are overlapped with each other when seen in the opposing direction.

In the piezoelectric element according to the one aspect of the present invention, a region demarcated by the plurality of first through-hole conductors may have an n-gon shape (n is integer number equal to or larger than 4) when seen in the opposing direction. In this case, since cracks are further controlled so as not to be extended, it becomes possible to further control a decrease in strength.

DETAILED DESCRIPTION

An embodiment will be described with reference to the drawings. The following present embodiment is an example for description of the present invention and is not to limit the present invention to the following contents. In the description, the same sign is used for identical elements or elements having identical functions, and overlapped description is omitted.

Figure 1A:
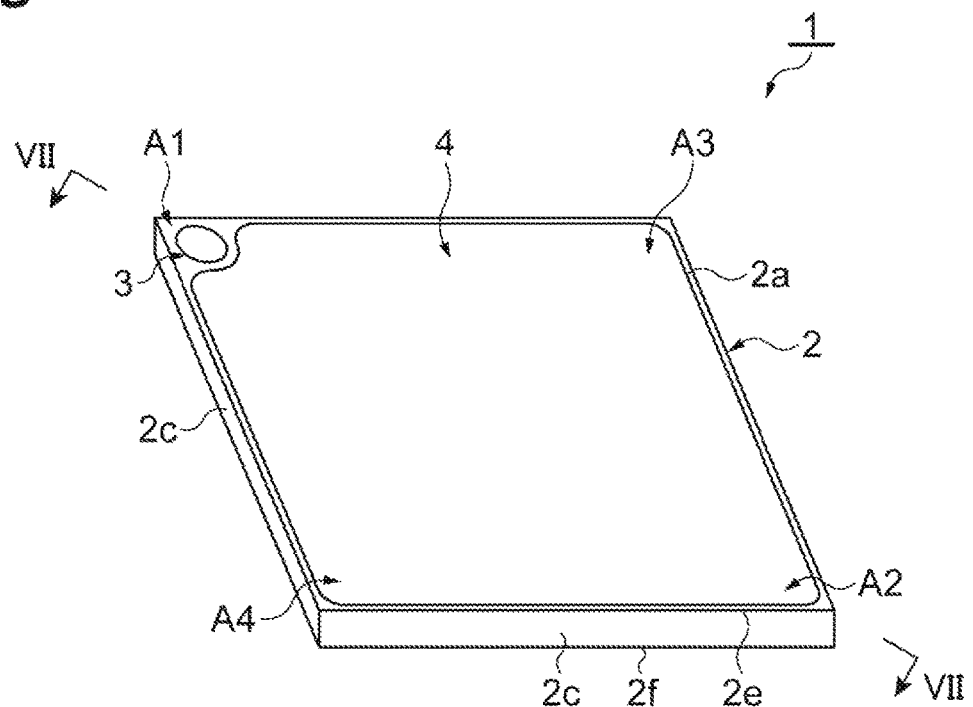
FIG. 1A to FIG. 1C are a perspective view illustrating a piezoelectric element according to an embodiment from an upper side and top views of corner parts.
Figure 1B:
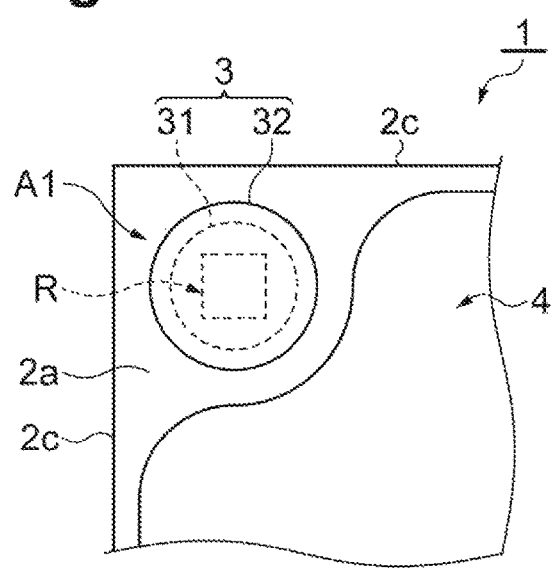
Figure 1C:
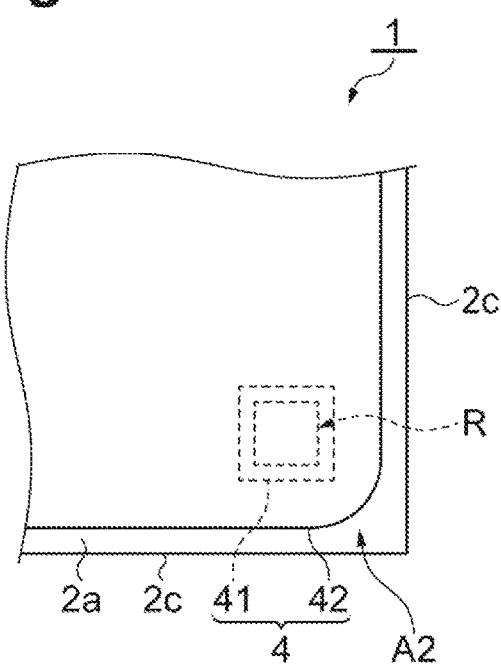
Figure 2A:
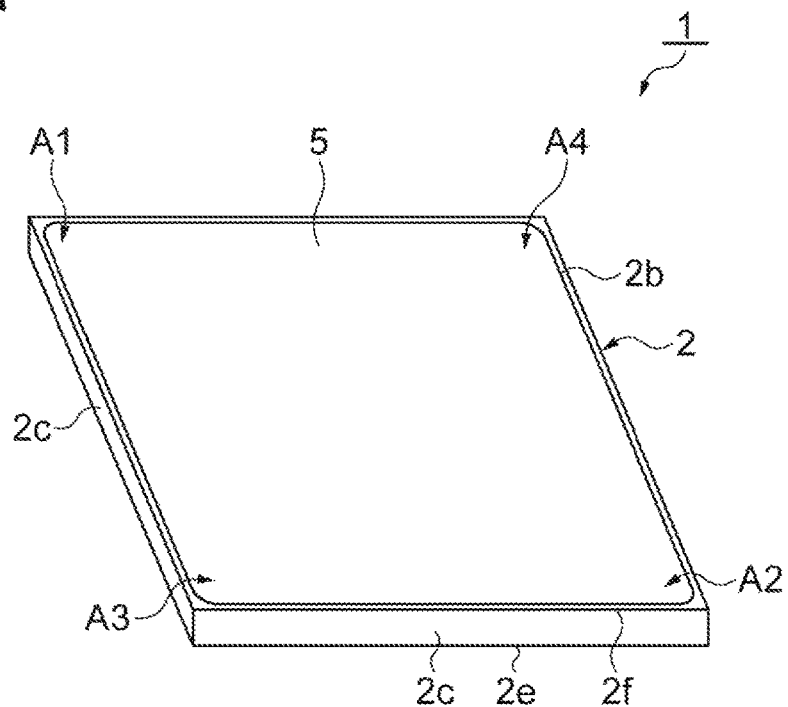
FIG. 2A to FIG. 2C are a perspective view illustrating the piezoelectric element according to the embodiment from a lower side and bottom views of the corner parts.
Figure 2B:
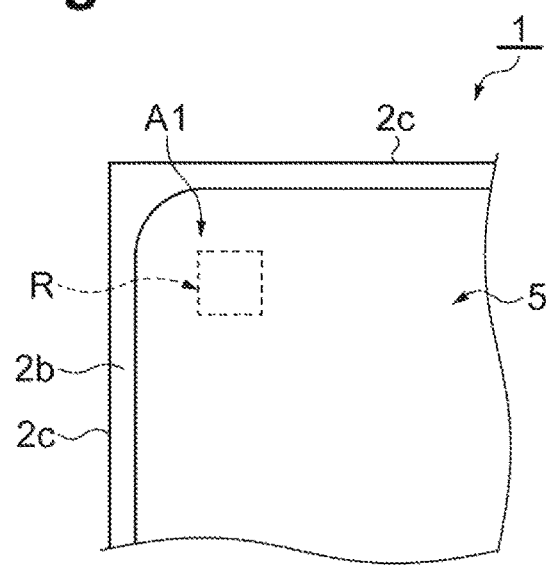
Figure 2C:
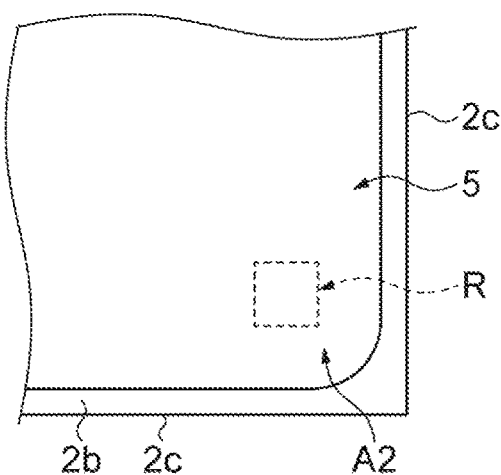
Figure 3:
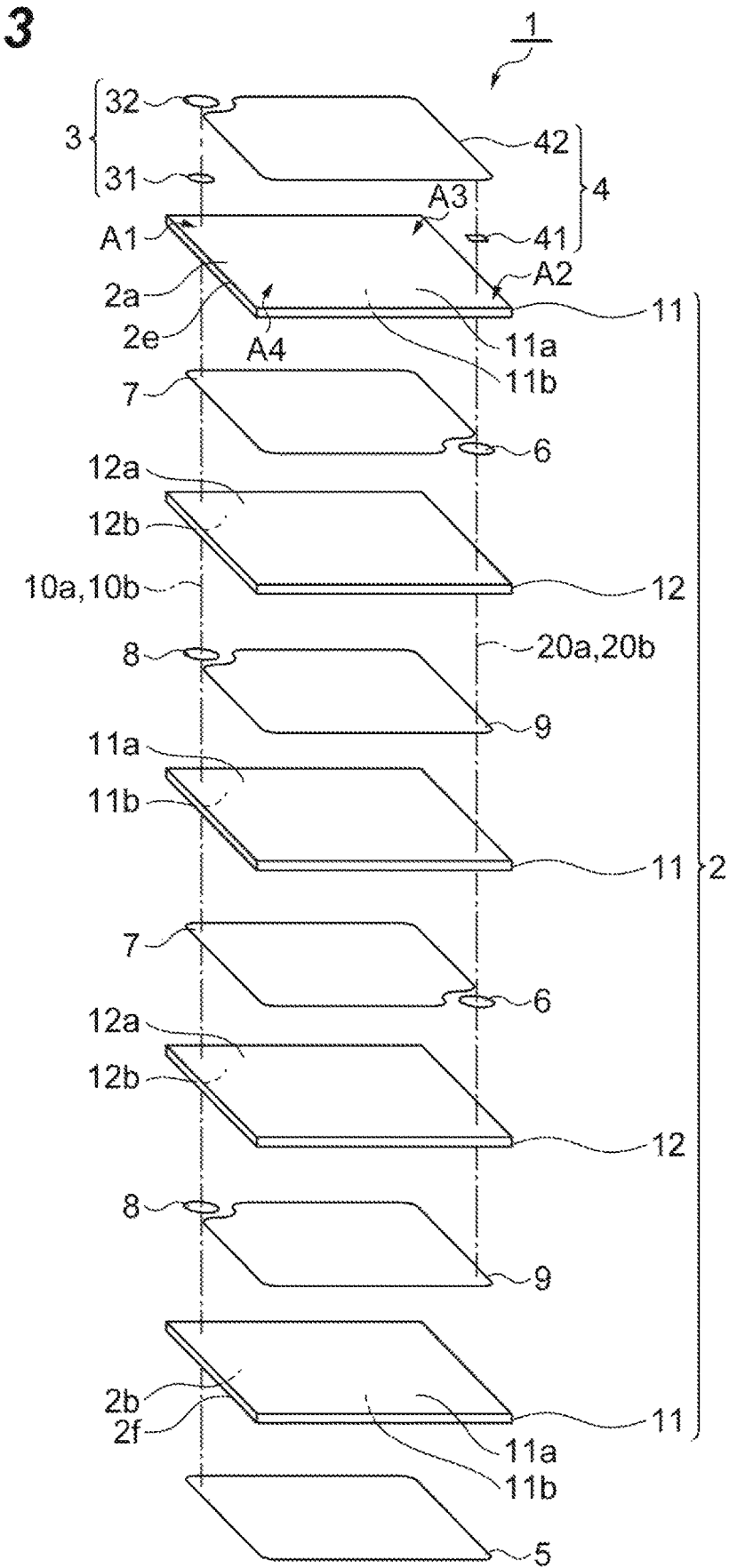
FIG. 3 is an exploded perspective view of the piezoelectric element in FIG. 1A.

FIG. 1A is a perspective view illustrating a piezoelectric element according to the embodiment from an upper side. FIG. 1B is a top view illustrating a corner part A1 in an enlarged manner. FIG. 1C is a top view illustrating a corner part A2 in an enlarged manner. FIG. 2A is a perspective view of illustrating the piezoelectric element according to the embodiment from a lower side. FIG. 2B is a bottom view illustrating the corner part A1 in an enlarged manner. FIG. 2C is a bottom view illustrating the corner part A2 in an enlarged manner. FIG. 3 is an exploded perspective view of the piezoelectric element in FIG. 1A.

As illustrated in FIG. 1A to FIG. 1C, FIG. 2A to FIG. 2C, and FIG. 3, a piezoelectric element 1 includes a piezoelectric element body 2, an external electrode 3, an external electrode 4, an external electrode 5, an inner electrode 6, an inner electrode 7, an inner electrode 8, an inner electrode 9, a plurality of through-hole conductors 10a, a plurality of through-hole conductors 10b, a plurality of through-hole conductors 20a, and a plurality of through-hole conductors 20b. The piezoelectric element 1 is a so-called laminated piezoelectric element.

The piezoelectric element body 2 has a rectangular parallelepiped shape. The piezoelectric element body 2 has a pair of principal surfaces 2a and 2b opposing each other, and four side surfaces 2c. Each of the side surfaces 2c is extended in a direction in which the pair of principal surfaces 2a and 2b opposes each other (hereinafter, referred to as "principal surface opposing direction") in such a way that the pair of principal surfaces 2a and 2b is coupled. The principal surface opposing direction is, for example, a direction orthogonal to each of the principal surfaces 2a and 2b. The rectangular parallelepiped shape includes a rectangular parallelepiped shape in which a corner part and a ridge part are chamfered, and a rectangular parallelepiped shape in which a corner part and a ridge part are rounded.

The piezoelectric element body 2 has four corner parts A1 to A4 when seen in the principal surface opposing direction. The corner part A1 and the corner part A2 are placed diagonally. The corner part A3 and the corner part A4 are placed diagonally. Each of the corner part A3 and the corner part A4 is next to the corner part A1 and the corner part A2. Each of the pair of principal surfaces 2a and 2b has, for example, a rectangular shape. The principal surface 2a has a rectangular outer edge 2e. The principal surface 2b has a rectangular outer edge 2f.

A direction in which the pair of principal surfaces 2a and 2b opposes each other is a thickness direction of the piezoelectric element body 2. A direction in which a pair of side surfaces 2c opposes each other is a length direction of the piezoelectric element body 2. A direction in which the other pair of side surfaces 2c opposes each other is a width direction of the piezoelectric element body 2. A length in the thickness direction of the piezoelectric element body 2 is, for example, 0.1 mm. A length in the length direction of the piezoelectric element body 2 is, for example, 30 mm. A length in the width direction of the piezoelectric element body 2 is, for example, 30 mm.

The piezoelectric element body 2 includes a piezoceramic material (piezoelectric material). As a piezoceramic material, there is PZT [Pb(Zr,Ti)$O_3$], PT (PbTi$O_3$), PLZT [(Pb, La)(Zr,Ti)$O_3$], barium titanate (BaTi$O_3$), bismuth sodium titanate (BNT), potassium sodium niobate (KNN), or the like.

The piezoelectric element body 2 includes a plurality of piezoelectric body layers 11 and 12 alternately laminated in the principal surface opposing direction. The piezoelectric body layers 11 and 12 have the same shape. The piezoelectric body layers 11 and 12 have a rectangular plate-like shape. The piezoelectric element body 2 has, for example, a configuration in which the piezoelectric body layers 12 and 11 are alternately laminated for n times each on the piezoelectric body layer 11. That is, the piezoelectric element body 2 includes the piezoelectric body layer 11 at each end in the principal surface opposing direction. In the present embodiment, n is 2.

The piezoelectric body layer 11 has a pair of principal surfaces 11a and 11b that have, for example, rectangular shapes and that oppose each other. The piezoelectric body layer 12 has a pair of principal surfaces 12a and 12b that have, for example, rectangular shapes and that oppose each other. An opposing direction of the pair of principal surfaces 11a and 11b matches the principal surface opposing direction. An opposing direction of the pair of principal surfaces 12a and 12b matches the principal surface opposing direction. In the piezoelectric element body 2, the principal surface 12a opposes the principal surface 11b, and the principal surface 12b opposes the principal surface 11a. Each of the piezoelectric body layers 11 and 12 has four corner parts corresponding to the four corner parts A1 to A4.

The principal surface 2a of the piezoelectric element body 2 includes a principal surface 11a of a piezoelectric body layer 11 disposed at one end in the principal surface opposing direction (hereinafter, also referred to as "piezoelectric body layer 11 at one end") among the plurality of piezoelectric body layers 11. The principal surface 2b of the piezoelectric element body 2 includes a principal surface 11b of a piezoelectric body layer 11 disposed at the other end in the principal surface opposing direction (hereinafter, also referred to as "piezoelectric body layer 11 at the other end") among the plurality of piezoelectric body layers 11. Each of the piezoelectric body layers 11 and 12 includes, for example, a sintered body of a ceramic green sheet including the above-described piezoceramic material. In an actual piezoelectric element body 2, piezoelectric body layers 11 and 12 are integrated in such a way that no boundary can be visually recognized between the piezoelectric body layers 11 and 12.

The plurality of piezoelectric body layers 11 and 12 are alternately laminated between the external electrodes 3 to 5 via the inner electrodes 6 to 9. More specifically, in the principal surface opposing direction, the external electrodes 3 and 4, the piezoelectric body layer 11 at one end, the inner electrodes 6 and 7, the piezoelectric body layer 12, the inner electrodes 8 and 9, a piezoelectric body layer 11 disposed between the piezoelectric body layer 11 at one end and the piezoelectric body layer 11 at the other end (hereinafter, also referred to as "piezoelectric body layer 11 in the middle"), the inner electrodes 6 and 7, the piezoelectric body layer 12, the inner electrodes 8 and 9, the piezoelectric body layer 11 at the other end, and the external electrode 5 are disposed side by side in this order.

The piezoelectric body layer 11 at one end is disposed between the external electrodes 3 and 4 and the inner electrodes 6 and 7. The external electrodes 3 and 4 are provided on the principal surface 11a of the piezoelectric body layer 11 at one end. The inner electrodes 6 and 7 are provided on a principal surface 11b of the piezoelectric body layer 11 at one end. The piezoelectric body layer 11 in the middle is disposed between the inner electrodes 8 and 9 and the inner electrodes 6 and 7. The inner electrodes 8 and 9 are provided on a principal surface 11a of the piezoelectric body layer 11 in the middle. The inner electrodes 6 and 7 are provided on a principal surface 11b of the piezoelectric body layer 11 in the middle. The piezoelectric body layer 11 at the other end is disposed between the inner electrodes 8 and 9 and the external electrode 5. The inner electrodes 8 and 9 are provided on a principal surface 11a of the piezoelectric body layer 11 at the other end. The external electrode 5 is provided on the principal surface 11b of the piezoelectric body layer 11 at the other end. Each piezoelectric body layer 12 is disposed between the inner electrodes 6 and 7 and the inner electrodes 8 and 9. The inner electrodes 6 and 7 are provided on a principal surface 12a of each piezoelectric body layer 12. The inner electrodes 8 and 9 are provided on a principal surface 12b of each piezoelectric body layer 12.

The piezoelectric body layer 11 at one end and a piezoelectric body layer 12 oppose each other via the inner electrodes 6 and 7. The piezoelectric body layer 12 and the piezoelectric body layer 11 in the middle oppose each other via the inner electrodes 8 and 9. The piezoelectric body layer 11 in the middle and a piezoelectric body layer 12 oppose each other via the inner electrodes 6 and 7. The piezoelectric body layer 12 and the piezoelectric body layer 11 at the other end oppose each other via the inner electrodes 8 and 9. In other words, the external electrodes 3 and 4 and the inner electrodes 6 and 7 oppose each other via the piezoelectric body layer 11 at one end. The inner electrodes 6 and 7 and the inner electrodes 8 and 9 oppose each other via each piezoelectric body layer 12. The inner electrodes 8 and 9 and the external electrode 5 oppose each other via the piezoelectric body layer 11 at the other end. An opposing direction of these electrodes matches the principal surface opposing direction.

The external electrode 3 is provided on the principal surface 2a (that is, principal surface 11a). The external electrode 4 is provided on the principal surface 2a in such a way that the external electrode 4 is separated from the external electrode 3. The external electrodes 3 and 4 are separated from the outer edge 2e of the principal surface 2a when seen in the principal surface opposing direction. A distance of separation between the external electrodes 3 and 4 and the outer edge 2e is 20 μm or longer.

The external electrode 3 is provided at the corner part A1. The external electrode 3 includes an electrode layer 31 connected to a plurality of through-hole conductors 10a, and an electrode layer 32 that covers the electrode layer 31. The electrode layer 31 has a circular shape when seen in the principal surface opposing direction. The electrode layer 32 has a circular shape concentric with the electrode layer 31 when seen in the principal surface opposing direction. An area of the electrode layer 32 is larger than an area of the electrode layer 31 when seen in the principal surface opposing direction. The electrode layer 32 covers the whole electrode layer 31. The electrode layer 32 has a part overlapped with the electrode layer 31, and a part that is placed on an outer side of the electrode layer 31 and that is in contact with the principal surface 2a when seen in the principal surface opposing direction.

The external electrode 4 includes an electrode layer 41 connected to a plurality of through-hole conductors 20a, and an electrode layer 42 that covers the electrode layer 41. The electrode layer 41 has a rectangular shape when seen in the principal surface opposing direction. The electrode layer 41 is provided at the corner part A2. When seen in the principal surface opposing direction, the electrode layer 42 is provided in a region in which a separation region between the external electrodes 3 and 4 and the outer edge 2e and a disposed region of the external electrode 3 are excluded from the rectangular piezoelectric element body 2.

The electrode layer 42 has a round corner at each of the corner parts A1 to A4 when seen in the principal surface opposing direction. Here, the round corner does not mean a corner where two straight lines intersect but means a curved corner where end parts of two straight lines are connected to each other with a curved line. When seen in the principal surface opposing direction, a round corner of the electrode layer 42 is a curved corner where end parts of two straight lines of an outer edge of the electrode layer 42 along the outer edge 2e are connected to each other with a curved line. An area of the electrode layer 42 is larger than an area of the electrode layer 41 when seen in the principal surface opposing direction. The electrode layer 42 covers the whole electrode layer 41. The electrode layer 42 has a part overlapped with the electrode layer 41, and a part that is placed on an outer side of the electrode layer 41 and that is in contact with the principal surface 2a when seen in the principal surface opposing direction.

The external electrode 5 is provided on the principal surface 2b. The external electrode 5 is separated from the outer edge 2f of the principal surface 2b when seen in the principal surface opposing direction. A distance of separation between the external electrode 5 and the outer edge 2f is 20 μm or longer. When seen in the principal surface opposing direction, the external electrode 5 is provided in a region in which a separation region between the external electrode 5 and the outer edge 2f is excluded from the rectangular piezoelectric element body 2. The external electrode 5 has a round corner at each of the corner parts A1 to A4 when seen in the principal surface opposing direction. When seen in the principal surface opposing direction, a round corner of the external electrode 5 is a curved corner at which end parts of two straight lines along the outer edge 2f are connected to each other with a curved line in an outer edge of the external electrode 5.

Figure 4:
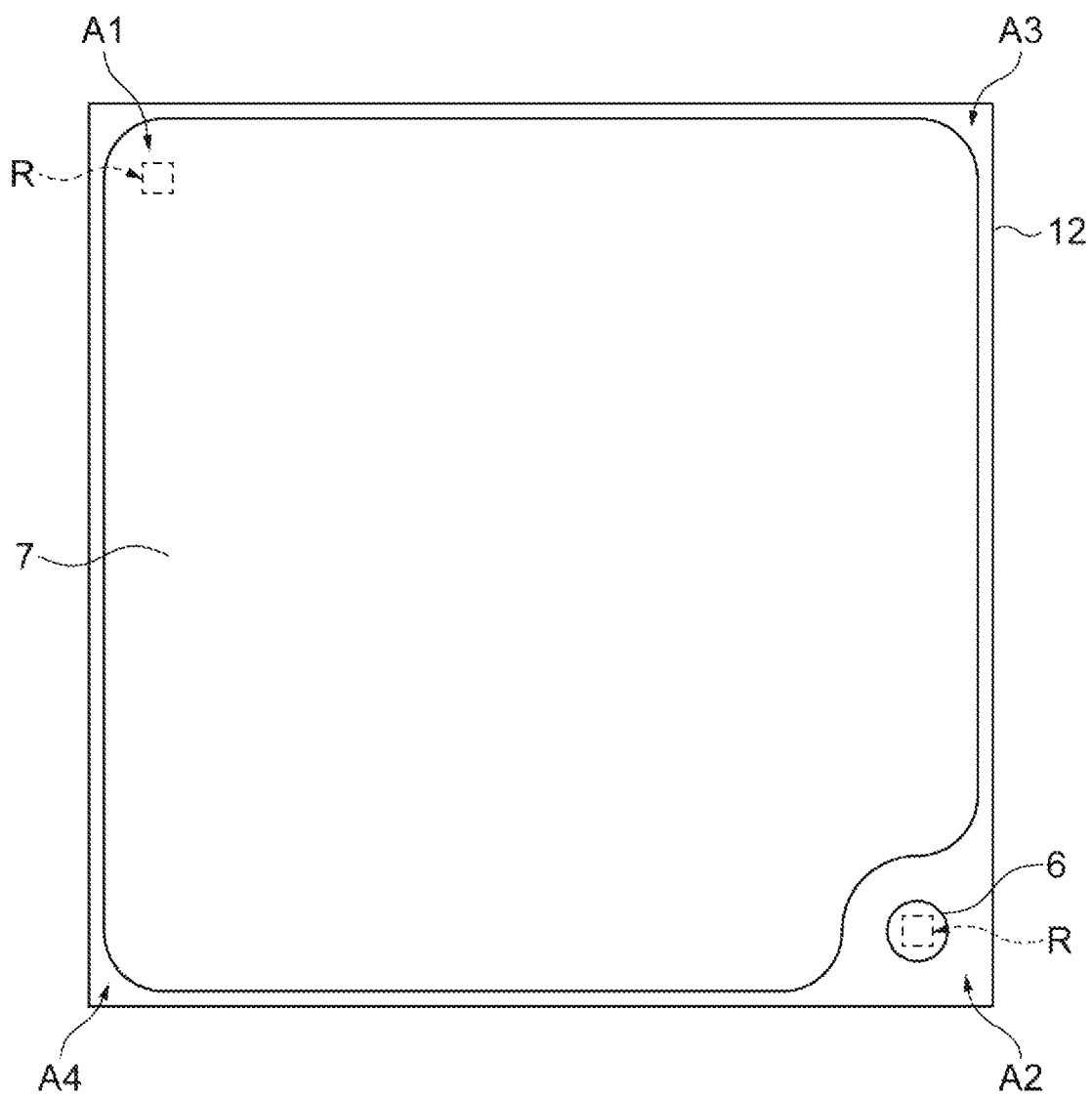
FIG. 4 is a view for describing an inner electrode illustrated in FIG. 3.
Figure 5:
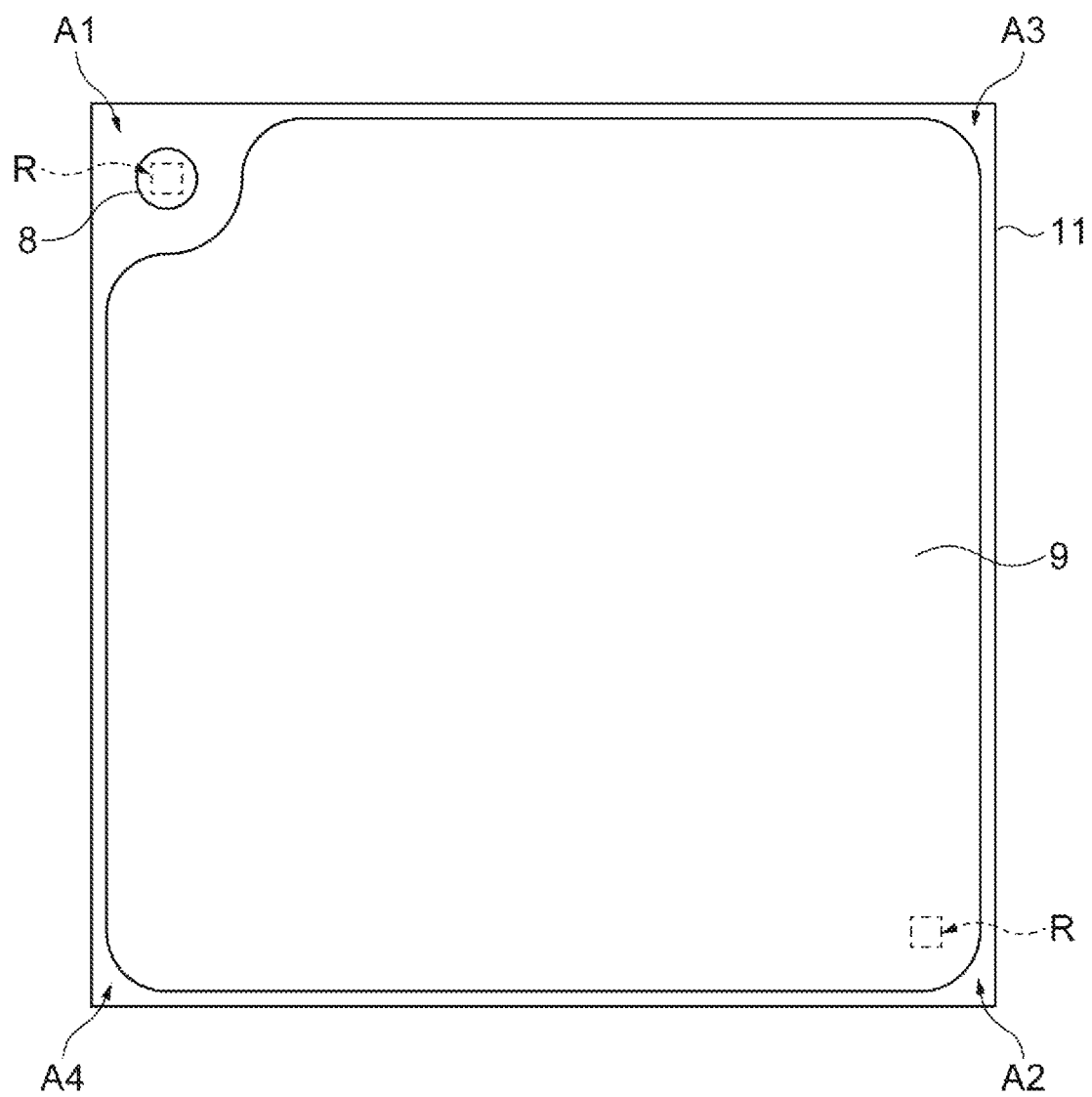
FIG. 5 is a view for describing an inner electrode illustrated in FIG. 3.

FIG. 4 and FIG. 5 are views for describing an inner electrode illustrated in FIG. 3. FIG. 4 is a view for describing the inner electrodes 6 and 7. In FIG. 4, the piezoelectric body layer 12, and the inner electrodes 6 and 7 are illustrated. FIG. 5 is a view for describing the inner electrodes 8 and 9. In FIG. 5, the piezoelectric body layer 11 in the middle, and the inner electrodes 8 and 9 are illustrated.

As illustrated in FIG. 1A to FIG. 5, the inner electrodes 6 and 7 are separated from each other when seen in the principal surface opposing direction. The inner electrodes 6 and 7 are separated from each of the side surfaces 2c when seen in the principal surface opposing direction. In other words, the inner electrodes 6 and 7 are separated from any of outer edges of the principal surfaces 11b and 12a on which the inner electrodes 6 and 7 are provided. A distance of separation between the inner electrodes 6 and 7 and each of the side surfaces 2c is 20 μm or longer.

The inner electrode 6 has a circular shape when seen in the principal surface opposing direction. The inner electrode 6 is provided at the corner part A2. When seen in the principal surface opposing direction, the inner electrode 7 is provided in a region in which a separation region between the inner electrodes 6 and 7 and each of the side surfaces 2c and a disposed region of the inner electrode 6 are excluded from the rectangular piezoelectric element body 2. The inner electrode 7 has a round corner at each of the corner parts A1 to A4 when seen in the principal surface opposing direction. When seen in the principal surface opposing direction, a round corner of the inner electrode 7 is a curved corner at which end parts of two straight lines along the side surfaces 2c are connected to each other with a curved line in the outer edge of the inner electrode 7.

The inner electrodes 8 and 9 are separated from each other when seen in the principal surface opposing direction. The inner electrodes 8 and 9 are separated from each of the side surfaces 2c when seen in the principal surface opposing direction. In other words, the inner electrodes 8 and 9 are separated from any of outer edges of the principal surfaces 11a and 12b on which the inner electrodes 8 and 9 are provided. A distance of separation between the inner electrodes 8 and 9 and each of the side surfaces 2c is 20 μm or longer.

The inner electrode 8 has a circular shape when seen in the principal surface opposing direction. The inner electrode 8 is overlapped with the corner part A1 when seen in the principal surface opposing direction. The inner electrode 9 has a shape identical with that of the electrode layer 41 and matches the electrode layer 41 in the principal surface opposing direction. When seen in the principal surface opposing direction, the inner electrode 9 is provided in a region in which a separation region between the inner electrodes 8 and 9 and each of the side surfaces 2c and a disposed region of the inner electrode 8 are excluded from the piezoelectric element body 2. The inner electrode 9 has a round corner at each of the corner parts A1 to A4 when seen in the principal surface opposing direction. When seen in the principal surface opposing direction, a round corner of the inner electrode 9 is a curved corner at which end parts of two straight lines along the side surfaces 2c are connected to each other with a curved line in the outer edge of the inner electrode 9.

As described above, since each of the principal surfaces 11a, 11b, 12a, and 12b of the present embodiment has a rectangular shape, a corner where two straight lines intersect. That is, a shape of a corner of each of the principal surfaces 11a, 11b, 12a, and 12b is different from a shape of a corner of each of the electrode layer 42, the external electrode 5, and the inner electrodes 7 and 9.

Figure 6:
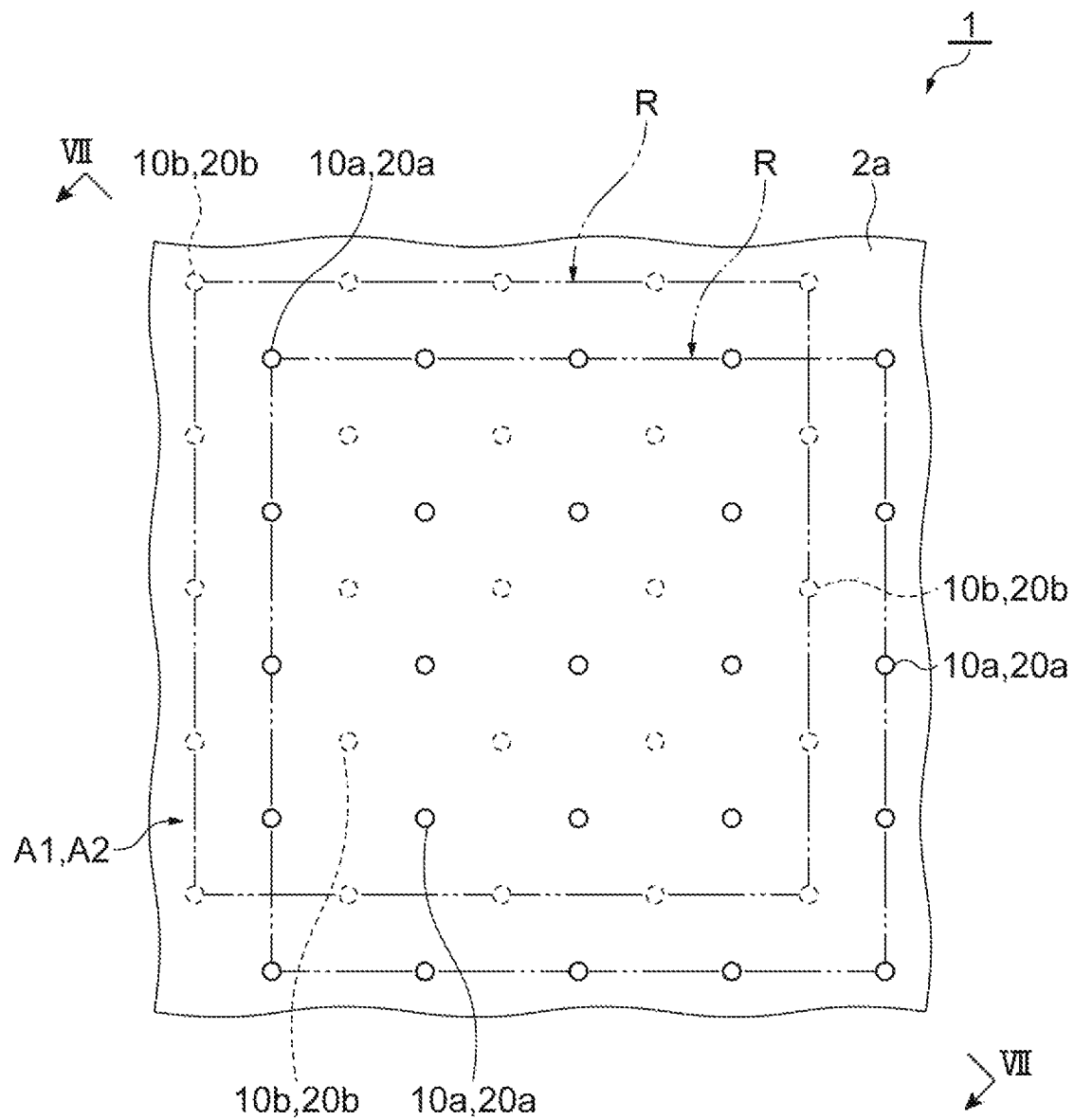
FIG. 6 is a plan view illustrating a part of the piezoelectric element in FIG. 1A in an enlarged manner.
Figure 7:
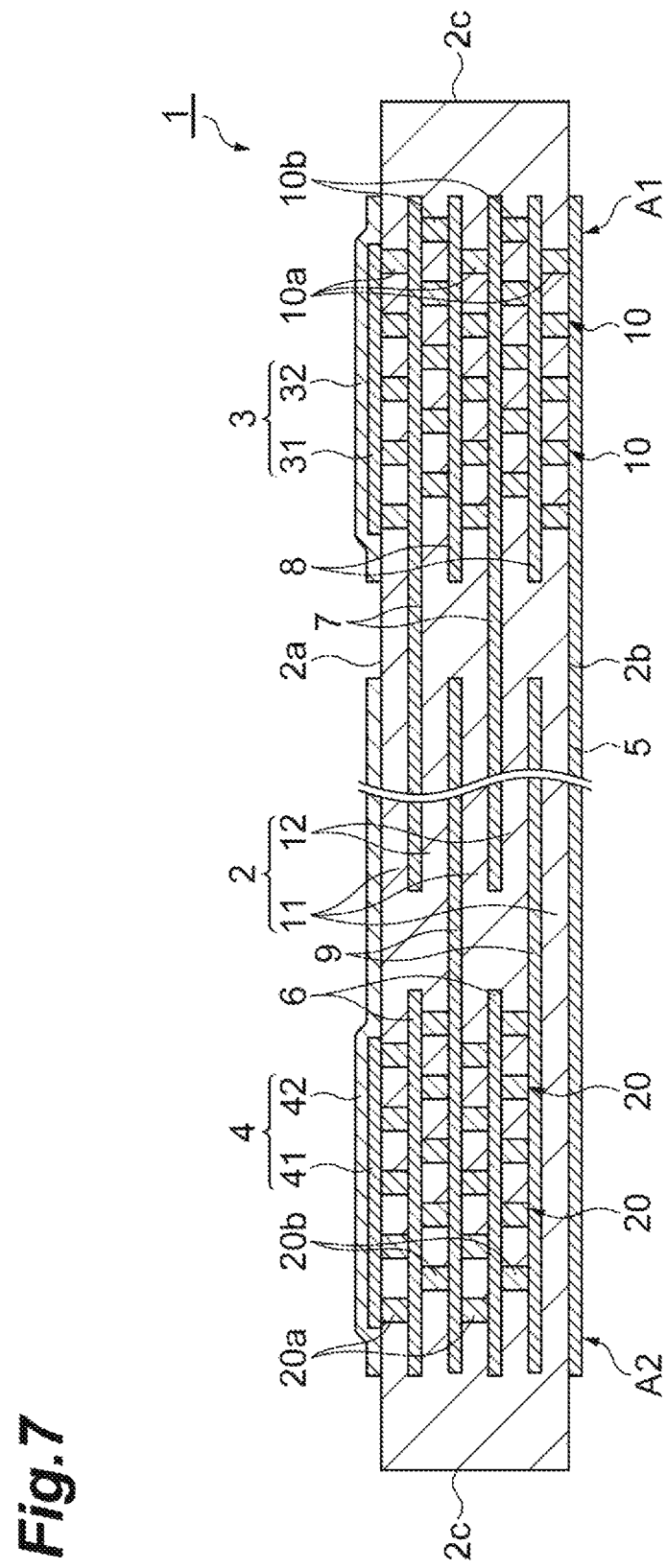
FIG. 7 is a VII-VII sectional view of FIG. 1A and FIG. 6.

FIG. 6 is a plan view illustrating a part of the piezoelectric element in FIG. 1A in an enlarged manner. In FIG. 6, illustration of the external electrodes 3 and 4 provided on the principal surface 2a is omitted. FIG. 7 is a VII-VII sectional view of FIG. 1A and FIG. 6. As illustrated in FIG. 3, FIG. 6, and FIG. 7, the plurality of through-hole conductors 10a and 10b, and the plurality of through-hole conductors 20a and 20b are disposed in such a way as to be separated from each other when seen in the principal surface opposing direction. The plurality of through-hole conductors 10a and 10b is disposed at the corner part A1. The plurality of through-hole conductors 20a and 20b is disposed at the corner part A2.

The plurality of through-hole conductors 10a penetrates each piezoelectric body layer 11. The plurality of through-hole conductors 10a is disposed in such a way that the plurality of through-hole conductors 10a is overlapped with each other when seen in the principal surface opposing direction. The plurality of through-hole conductors 10b penetrates each piezoelectric body layer 12. The plurality of through-hole conductors 10b is disposed in such a way that the plurality of through-hole conductors 10b is overlapped with each other when seen in the principal surface opposing direction. The plurality of through-hole conductors 10a and the plurality of through-hole conductors 10b are disposed in such a way as to be separated from each other when seen in the principal surface opposing direction.

The plurality of through-hole conductors 10a penetrating the piezoelectric body layer 11 at one end is physically and electrically connected to the electrode layer 31 and the inner electrode 7. The plurality of through-hole conductors 10a penetrating the piezoelectric body layer 11 in the middle is physically and electrically connected to the inner electrode 7 and the inner electrode 8. The plurality of through-hole conductors 10a penetrating the piezoelectric body layer 11 at the other end is physically and electrically connected to the external electrode 5 and the inner electrode 8. The plurality of through-hole conductors 10b penetrating each piezoelectric body layer 12 is physically and electrically connected to the inner electrode 7 and the inner electrode 8. The plurality of through-hole conductors 10a and the plurality of through-hole conductors 10b are electrically connected to each other by the inner electrode 7 or the inner electrode 8.

The plurality of through-hole conductors 20a penetrates each piezoelectric body layer 11. The plurality of through-hole conductors 20a is disposed in such a way that the plurality of through-hole conductors 20a is overlapped with each other when seen in the principal surface opposing direction. The plurality of through-hole conductors 20b penetrates each piezoelectric body layer 12. The plurality of through-hole conductors 20b is disposed in such a way that the plurality of through-hole conductors 20b is overlapped with each other when seen in the principal surface opposing direction. The plurality of through-hole conductors 20a and the plurality of through-hole conductors 20b are disposed in such a way as to be separated from each other when seen in the principal surface opposing direction.

The plurality of through-hole conductors 20a penetrating the piezoelectric body layer 11 at one end is physically and electrically connected to the electrode layer 41 and the inner electrode 6. The plurality of through-hole conductors 20a penetrating the piezoelectric body layer 11 in the middle is physically and electrically connected to the inner electrode 6 and the inner electrode 9. The plurality of through-hole conductors 20b penetrating each piezoelectric body layer 12 is physically and electrically connected to the inner electrode 6 and the inner electrode 9. The plurality of through-hole conductors 20a and the plurality of through-hole conductors 20b are electrically connected to each other by the inner electrode 6 or the inner electrode 9.

The plurality of through-hole conductors 10a is arrayed in a matrix when seen in the principal surface opposing direction. The plurality of through-hole conductors 10a is arrayed, for example, at equal distances when seen in the principal surface opposing direction. The plurality of through-hole conductors 10a is disposed at intersection positions of a lattice at equal distances (that is, square lattice). The plurality of through-hole conductors 10b is arrayed in a matrix when seen in the principal surface opposing direction. The plurality of through-hole conductors 10b is arrayed, for example, at equal distances when seen in the principal surface opposing direction. The plurality of through-hole conductors 10b is disposed at intersection positions of a lattice at equal distances (that is, square lattice).

An array distance of the plurality of through-hole conductors 10a is equal to an array distance of the plurality of through-hole conductors 10b. As described above, the plurality of through-hole conductors 10a and the plurality of through-hole conductors 10b are disposed in such a way as to be separated from each other when seen in the principal surface opposing direction. The plurality of through-hole conductors 10a is disposed at positions moved in parallel for ½ of an array distance in a row direction and a column direction from the plurality of through-hole conductors 10b when seen in the principal surface opposing direction.

The plurality of through-hole conductors 20a is arrayed in a matrix when seen in the principal surface opposing direction. The plurality of through-hole conductors 20a is arrayed, for example, at equal distances when seen in the principal surface opposing direction. The plurality of through-hole conductors 20a is disposed at intersection positions of a lattice at equal distances (that is, square lattice). The plurality of through-hole conductors 20b is arrayed in a matrix when seen in the principal surface opposing direction. The plurality of through-hole conductors 20b is arrayed, for example, at equal distances when seen in the principal surface opposing direction. The plurality of through-hole conductors 20b is disposed at intersection positions of a lattice at equal distances (that is, square lattice).

An array distance of the plurality of through-hole conductors 20a is equal to an array distance of the plurality of through-hole conductors 20b. As described above, the plurality of through-hole conductors 20a and the plurality of through-hole conductors 20b are disposed in such a way as to be separated from each other when seen in the principal surface opposing direction. The plurality of through-hole conductors 20a is disposed at positions moved in parallel for ½ of an array distance in a row direction and a column direction from the plurality of through-hole conductors 20b when seen in the principal surface opposing direction. In the present embodiment, an array distance of the plurality of through-hole conductors 10a, an array distance of the plurality of through-hole conductors 10b, an array distance of the plurality of through-hole conductors 20a, and an array distance of the plurality of through-hole conductors 20b are equal to each other.

A region R demarcated by the plurality of through-hole conductors 10a has an n-gon shape (n is integer number equal to or larger than 4) when seen in the principal surface opposing direction. Here, when seen in the principal surface opposing direction, the region R has, for example, a polygonal shape in which through-hole conductors 10a placed at ends of an array among the plurality of through-hole conductors 10a (that is, through-hole conductor 10a placed at each end in each row, and through-hole conductor 10a placed at each end in each column) are connected with a straight line. That is, the region R has a columnar shape with this polygonal shape as a bottom surface.

In the present embodiment, 25 through-hole conductors 10a are arrayed in a matrix of 5×5 (that is, five row and five column). The region R has a quadrangle shape (more specifically, square shape) when seen in the principal surface opposing direction. That is, the region R has a quadrangular prism shape (more specifically, tetragonal prism shape). Each of the plurality of through-hole conductors 10b, the plurality of through-hole conductors 20a, and the plurality of through-hole conductors 20b demarcates a region R in a way similar to that by the plurality of through-hole conductors 10a.

Each of the external electrodes 3 to 5, the inner electrodes 6 to 9, and the plurality of through-hole conductors 10a, 10b, 20a, and 20b includes, for example, Ag, Pd, or Cu and is a conductor. These conductors are formed as sintered bodies of a conductive paste including a conductive material. The electrode layer 31 in the external electrode 3, the electrode layer 41 in the external electrode 4, the inner electrodes 6 to 9, and the plurality of through-hole conductors 10a, 10b, 20a, and 20b include, as a common material, a piezoelectric material included in the piezoelectric element body 2 in order to bring a contraction rate in burning closer to that of the piezoelectric element body 2. The electrode layer 32 in the external electrode 3 and the electrode layer 42 in the external electrode 4 do not include this piezoelectric material. That is, a content rate of a piezoelectric material in the electrode layers 32 and 42 is lower than a content rate of a piezoelectric material in the electrode layers 31 and 41. Thus, conductivity of the electrode layers 32 and 42 is higher than conductivity of the electrode layers 31 and 41.

Figure 8:
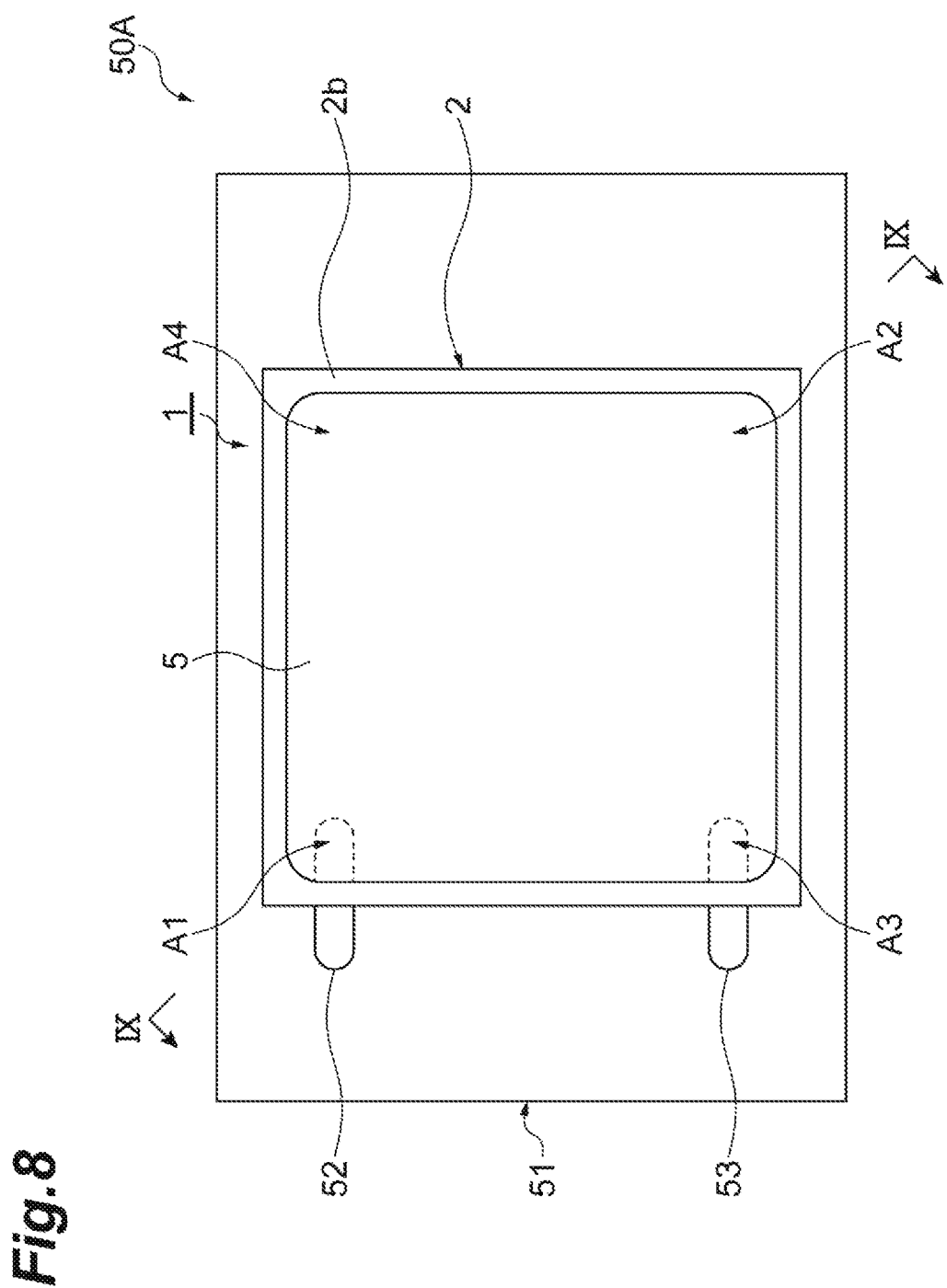
FIG. 8 is a plan view of an electronic device including the piezoelectric element in FIG. 1A.
Figure 9:
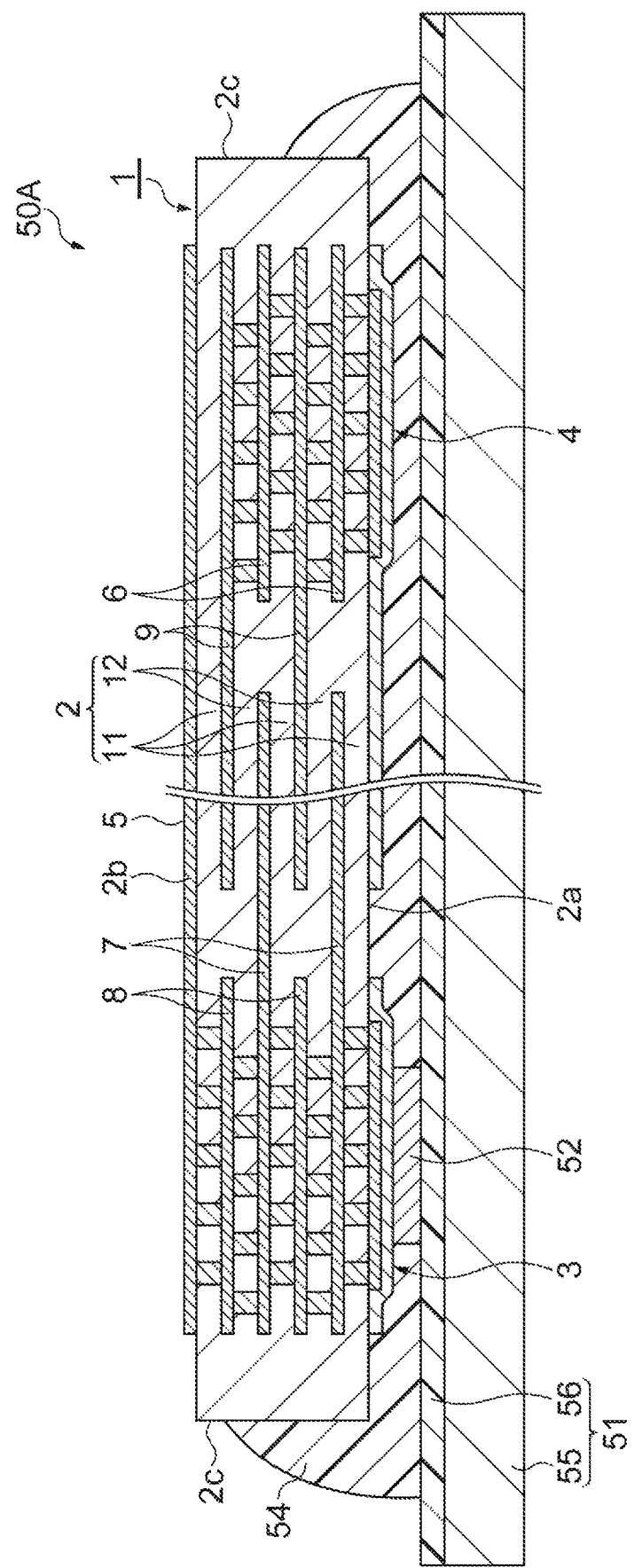
FIG. 9 is a IX-IX sectional view of FIG. 8.

FIG. 8 is a plan view of an electronic device including the piezoelectric element in FIG. 1A. FIG. 9 is a IX-IX sectional view of FIG. 8. An electronic device 50A illustrated in FIG. 8 and FIG. 9 is, for example, a vibration device. The electronic device 50A includes a piezoelectric element 1, a vibrating body 51, extraction electrodes 52 and 53, and an adhesive member 54.

The vibrating body 51 includes a metal plate 55, and an insulation layer 56 disposed on the metal plate 55. The vibrating body 51 is, for example, a rectangular plate-like member when seen in a principal surface opposing direction. The vibrating body 51 is disposed in such a way that the metal plate 55 and a principal surface 2a of the piezoelectric element 1 oppose each other via the insulation layer 56. The metal plate 55 includes, for example, Ni, stainless steel, brass, or an inver material (Ni—Mn—Fe). The insulation layer 56 is, for example, a polyimide resin or an epoxy resin. The insulation layer 56 covers the whole of one principal surface of the metal plate 55. A thickness of the insulation layer 56 is, for example, 5 μm.

The extraction electrodes 52 and 53 include, for example, Au, Sn, or Ni. The extraction electrodes 52 and 53 are disposed on the insulation layer 56 in such a way as to be separated from each other. The extraction electrode 52 is physically and electrically connected to an external electrode 3. The extraction electrode 53 is physically and electrically connected to an external electrode 4. The adhesive member 54 is, for example, an epoxy resin or an acrylic resin. The adhesive member 54 fixes the piezoelectric element 1 to the vibrating body 51 by joining the piezoelectric element 1 and the vibrating body 51.

For example, when voltage with different polarities is applied to the external electrodes 3 and 4 via the extraction electrodes 52 and 53, an electric field is generated between the external electrode 4, an inner electrode 7, an inner electrode 9, and an external electrode 5 in the electronic device 50A. Accordingly, a region sandwiched by the external electrode 4 and the inner electrode 7 in the piezoelectric body layer 11 at one end, a region sandwiched by the inner electrode 7 and the inner electrode 9 in the piezoelectric body layer 11 in the middle, a region sandwiched by the external electrode 5 and the inner electrode 9 in the piezoelectric body layer 11 at the other end, a region sandwiched by the inner electrode 7 and the inner electrode 9 in a piezoelectric body layer 12 become active regions that are piezoelectrically active, and displacement is generated in the active regions. In a case where the applied voltage is an AC voltage, the piezoelectric element 1 repeats expansion and contraction according to a frequency of the AC voltage. The piezoelectric element 1 and the vibrating body 51 are joined to each other by the adhesive member 54. Thus, the vibrating body 51 integrally deflects and vibrates with the piezoelectric element 1 in response to repetition of expansion and contraction in the piezoelectric element 1.

Figure 10:
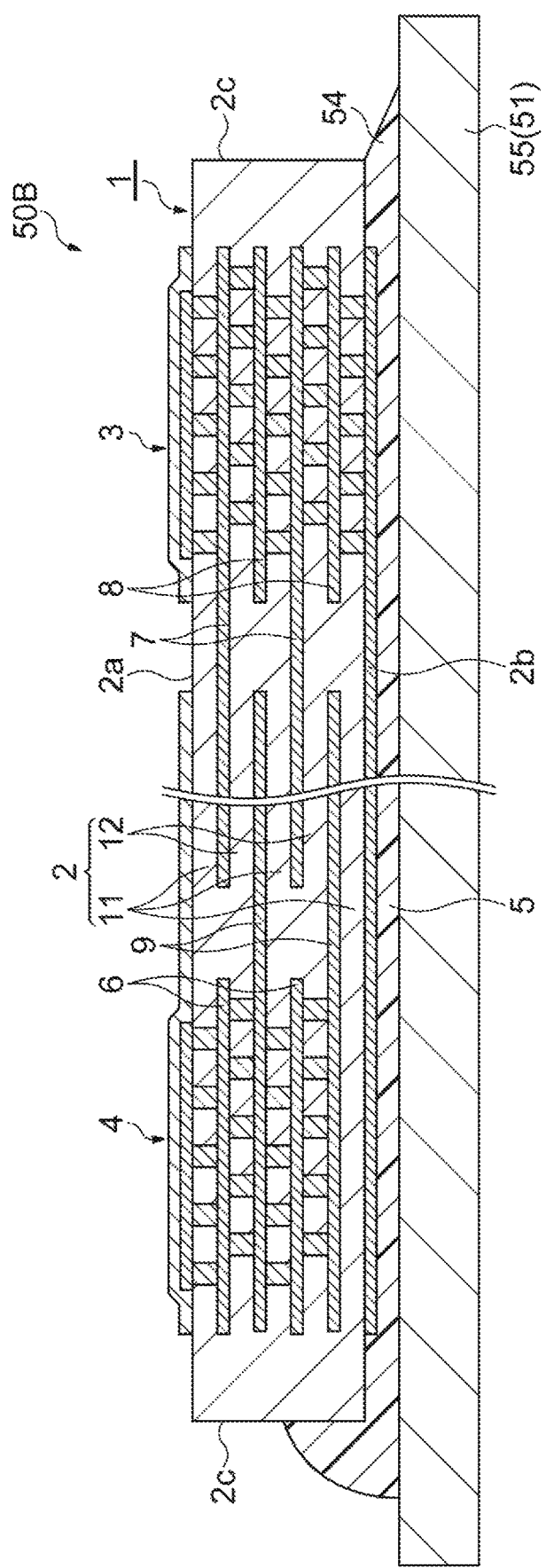
FIG. 10 is a sectional view of an electronic device according to a modification example.

FIG. 10 is a sectional view of an electronic device according to a modification example. An electronic device 50B illustrated in FIG. 10 is different from the electronic device 50A mainly in that extraction electrodes 52 and 53 are not included. In the electronic device 50B, a vibrating body 51 does not include an insulation layer 56. A metal plate 55 configures the vibrating body 51. A principal surface 2*b* of a piezoelectric element 1 opposes the vibrating body 51. The piezoelectric element 1 is fixed to the vibrating body 51 by an adhesive member 54 in a state in which a principal surface 2*a* is exposed. The adhesive member 54 includes a conductive filler and electrically connects an external electrode 5 and the metal plate 55. For example, in the electronic device 50B, it is possible to connect a lead wire to an external electrode 4 and to apply voltage to the external electrode 4 via the lead wire. For example, it is possible to apply voltage to the external electrode 5 via the metal plate 55. When voltage with different polarities is applied to the external electrodes 4 and 5, the electronic device 50B is driven in a way similar to that of the electronic device 50A and the vibrating body 51 performs deflection vibration.

Figure 11:
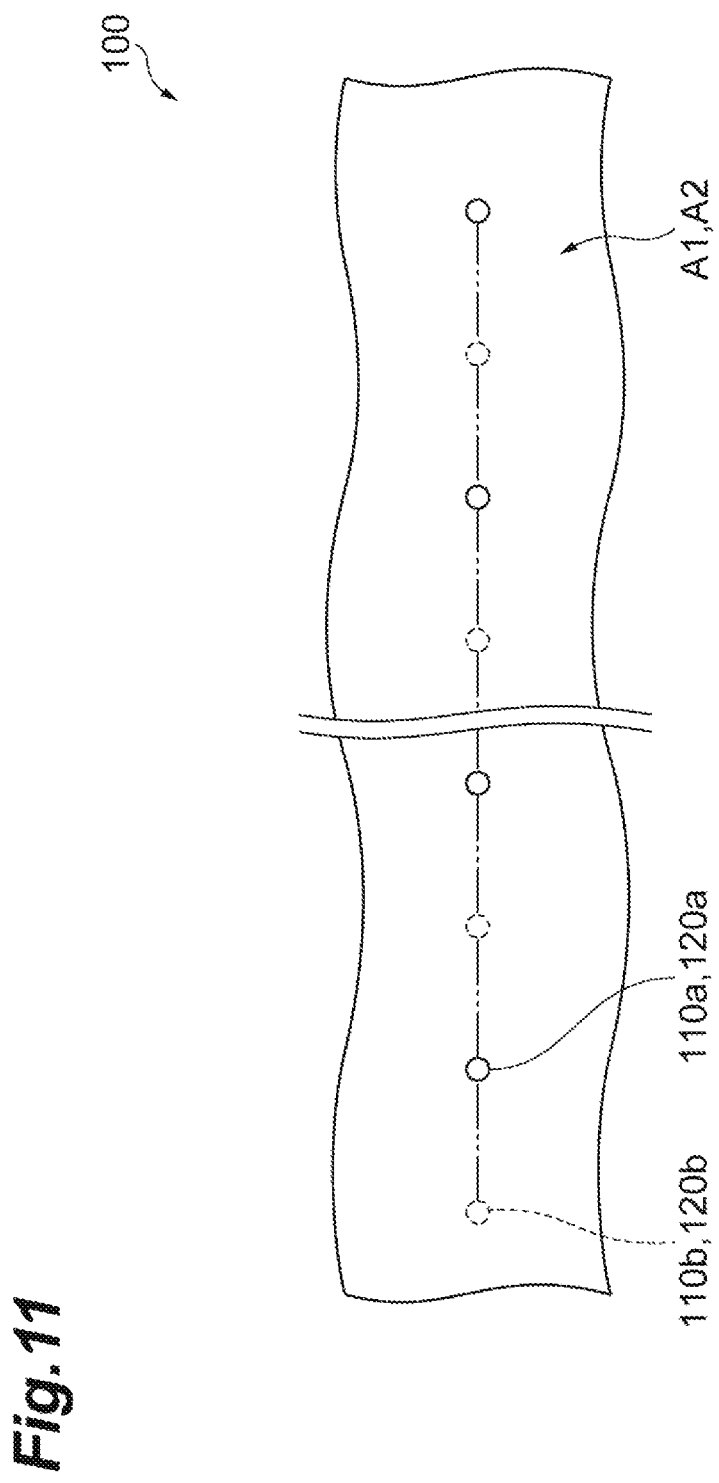
FIG. 11 is a plan view illustrating a part of a piezoelectric element according to a comparison example in an enlarged manner.

FIG. 11 is a plan view illustrating a part of a piezoelectric element according to a comparison example in an enlarged manner. As illustrated in FIG. 11, a piezoelectric element 100 according to a comparison example is mainly different from the piezoelectric element 1 in that a plurality of through-hole conductors 110*a*, 110*b*, 120*a*, and 120*b* arrayed at equal distances in a line is included instead of the plurality of through-hole conductors 10*a*, 10*b*, 20*a*, and 20*b*. In the piezoelectric element 100, a region demarcated by each of the plurality of through-hole conductors 110*a*, 110*b*, 120*a*, and 120*b* has a linear shape when seen in the principal surface opposing direction. In a case where each of the plurality of through-hole conductors 110*a*, 110*b*, 120*a*, and 120*b* is arrayed in a line, cracks are likely to be extended along a sequence of each of the through-hole conductors 110*a*, 110*b*, 120*a*, and 120*b*.

On the other hand, each of the plurality of through-hole conductors 10*a*, 10*b*, 20*a*, and 20*b* is arrayed in a matrix in the piezoelectric element 1. When it is assumed that the number of through-hole conductors and an array distance thereof in the piezoelectric element 1 and those in the piezoelectric element 100 are respectively equal to each other, a length of an array of the through-hole conductors in a line in the piezoelectric element 1 is shorter than that in the piezoelectric element 100. Accordingly, it is possible to control cracks so as not to be generated along through-hole conductors arrayed in a line in the piezoelectric element 1. Thus, it becomes possible to control a decrease in strength according to the piezoelectric element 1.

The piezoelectric element 1 includes the plurality of through-hole conductors 10*a* and 10*b*. The plurality of through-hole conductors 10*a* and 10*b* is disposed in such a way that the plurality of through-hole conductors 10*a* and 10*b* is separated from each other and is not over lapped with each other when seen in the principal surface opposing direction. The plurality of through-hole conductors 10*a* and 10*b* is electrically connected to each other by the inner electrode 7 or the inner electrode 8. That is, the plurality of through-hole conductors 10*a* and 10*b* is connected to different parts of the inner electrode 7 or the inner electrode 8. Thus, even when the plurality of through-hole conductors 10*a* and 10*b* contracts in firing, it is possible to control generation of conduction failure such as breaking in the plurality of through-hole conductors 10*a* and 10*b* compared to a case where a plurality of through-hole conductors 10*a* and 10*b* is overlapped with each other when seen in the principal surface opposing direction.

The piezoelectric element 1 includes the plurality of through-hole conductors 20*a* and 20*b*. The plurality of through-hole conductors 20*a* and 20*b* is disposed in such a way that the plurality of through-hole conductors 20*a* and 20*b* is separated from each other and is not overlapped with each other when seen in the principal surface opposing direction. The plurality of through-hole conductors 20*a* and 20*b* is electrically connected to each other by the inner electrode 6 or the inner electrode 9. That is, the plurality of through-hole conductors 20*a* and 20*b* is connected to different parts of the inner electrode 6 or the inner electrode 9. Thus, even when the plurality of through-hole conductors 20*a* and 20*b* contracts in firing, it is possible to control generation of conduction failure such as breaking in the plurality of through-hole conductors 20*a* and 20*b* compared to a case where the plurality of through-hole conductors 20*a* and 20*b* is overlapped with each other when seen in the principal surface opposing direction.

Since the piezoelectric element 1 includes the plurality of through-hole conductors 10*a*, 10*b*, 20*a*, and 20*b*, it is possible to make a diameter of each of the through-hole conductors 10*a*, 10*b*, 20*a*, and 20*b* small compared to a case where a through-hole conductor with a large diameter is included instead of the plurality of through-hole conductors 10*a*, 10*b*, 20*a*, and 20*b*. Thus, even when each of the through-hole conductors 10*a*, 10*b*, 20*a*, and 20*b* contracts in firing, a contraction rate thereof is lower than a contraction rate of the through-hole conductor with a large diameter. Thus, according to the piezoelectric element 1, it is possible to control generation of conduction failure such as breaking.

The present invention is not necessarily limited to the above-described embodiments, and various modifications can be made with the spirit and the scope thereof.

Figure 12:
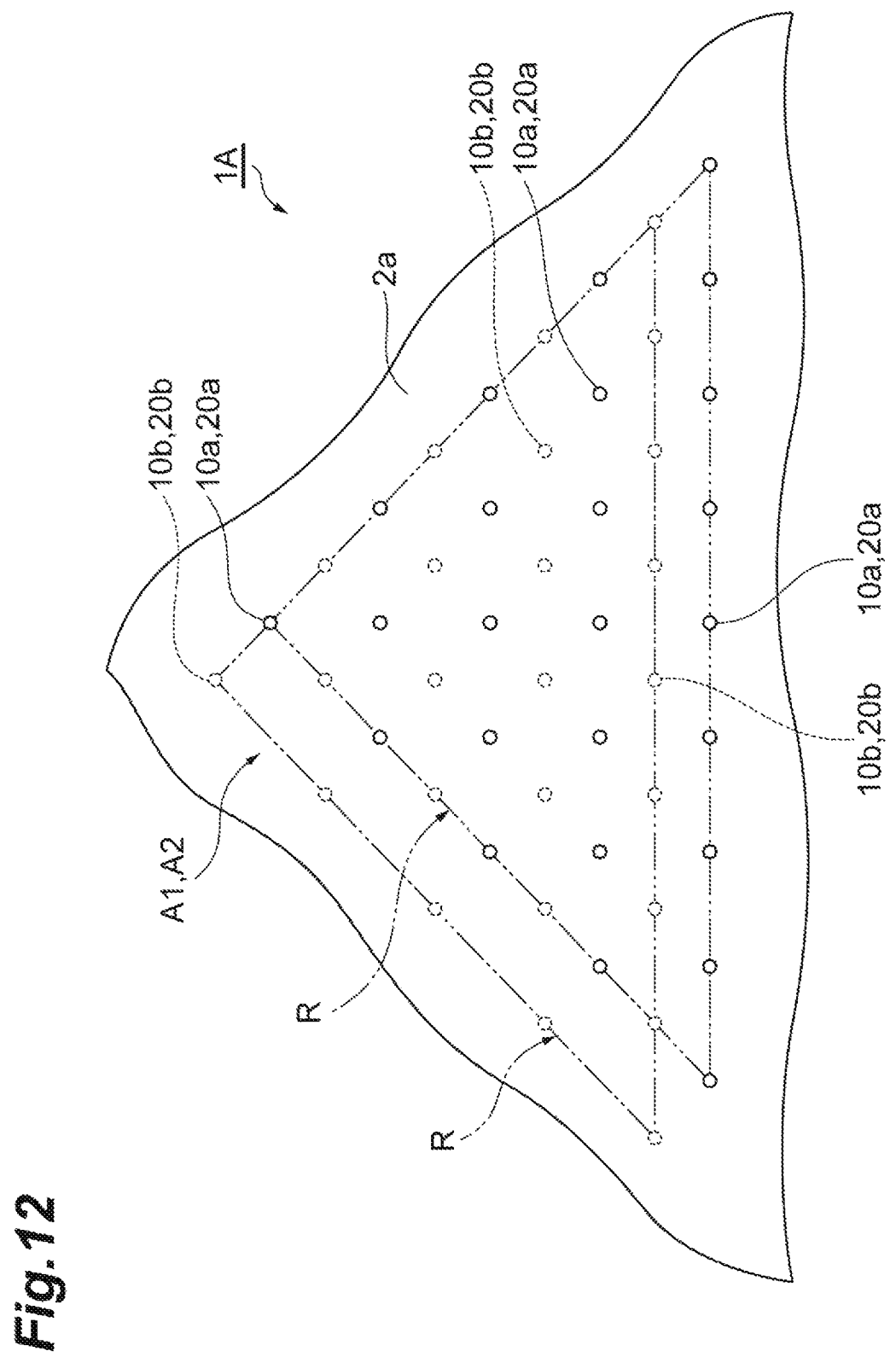
FIG. 12 is a plan view illustrating a piezoelectric element according to a modification example in an enlarged manner.

FIG. 12 is a plan view illustrating a piezoelectric element according to a modification example in an enlarged manner. As illustrated in FIG. 12, a piezoelectric element 1A according to a modification example is mainly different from the piezoelectric element 1 in that a region R demarcated by a plurality of through-hole conductors 10*a* and 10*b* has a triangular shape when seen in the principal surface opposing direction. That is, a region R demarcated by the plurality of through-hole conductors 10*a* and 10*b* has a triangular prism shape. The number of each of the plurality of through-hole conductors 10*a* and 10*b* in the piezoelectric element 1A is the same with that in the piezoelectric element 1 and is 25. An array distance of the plurality of through-hole conductors 10*a* and 10*b* is also the same with that in the piezoelectric element 1.

When it is assumed that the number of through-hole conductors and an array distance thereof in the piezoelectric element 1A and those in the piezoelectric element 100 (see FIG. 11) are respectively equal to each other, a length of an array of the through-hole conductors in a line in the piezoelectric element 1A according to the modification example can be also made shorter than that in the piezoelectric element 100. Thus, it becomes also possible to control a decrease in strength by the piezoelectric element 1A. Similarly to the piezoelectric element 1, each of regions R demarcated by a plurality of through-hole conductors 20*a* and 20*b* has a quadrangle shape in the piezoelectric element 1A when seen in the principal surface opposing direction. Since shapes of the regions R are different, it becomes easy to determine polarities in the piezoelectric element 1A.

When a case where a region R has a quadrangle shape in the principal surface opposing direction and a case where a region R has a triangular shape in the direction are compared, a length of an array of through-hole conductors in a line can be made shorter in the case of a quadrangle shape than in the case of a triangular shape. Thus, it is possible to control a decrease in strength in the case of a quadrangle shape compared to the case of a triangular shape. More specifically, for example, while five through-hole conductors 10a are arrayed at a maximum in one line in a region R demarcated by a plurality of through-hole conductors 10a in the piezoelectric element 1, nine through-hole conductors 10a are arrayed at a maximum in one line in a region R demarcated by a plurality of through-hole conductors 10a in the piezoelectric element 1A. Thus, it becomes further possible to control a decrease in strength in the piezoelectric element 1 compared to the piezoelectric element 1A.

In each of piezoelectric elements 1 and 1A, a plurality of through-hole conductors 10a may be replaced with one through-hole conductor with a large diameter, a plurality of through-hole conductors 10b may be replaced with one through-hole conductor with a large diameter, a plurality of through-hole conductors 20a may be replaced with one through-hole conductor with a large diameter, and a plurality of through-hole conductors 20b may be replaced with one through-hole conductor with a large diameter. Piezoelectric elements 1 and 1A are not necessarily laminated piezoelectric elements. That is, a piezoelectric element body 2 may include one piezoelectric body layer.

For example, a region R may have a rectangle shape, a rhombus shape, a pentagon shape, or a hexagon shape when seen in the principal surface opposing direction. For example, a plurality of through-hole conductors 10a and 10b may be disposed in such a way that a part thereof is overlapped with each other or a whole thereof is overlapped with each other when seen in the principal surface opposing direction. A plurality of through-hole conductors 20a and 20b may be disposed in such a way that a part thereof is overlapped with each other or a whole thereof is overlapped with each other when seen in the principal surface opposing direction.

What is claimed is:

1. A piezoelectric element comprising:
    first and second electrodes opposing each other;
    a first piezoelectric body layer disposed between the first electrode and the second electrode;
    a plurality of through-holes penetrating the first piezoelectric body layer; and
    a plurality of first through-hole conductors disposed in the plurality of through-holes, wherein;
    each of the plurality of first through-hole conductors is (1) directly connected to the first electrode and the second electrode and (2) surrounded by material of the first piezoelectric body layer; and
    the plurality of first through-hole conductors includes at least three through-hole conductors that are arrayed in a matrix when seen in an opposing direction of the first and second electrodes.

2. The piezoelectric element according to claim 1, further comprising:
    a second piezoelectric body layer opposing the first piezoelectric body layer via the second electrode;
    a third electrode opposing the second electrode via the second piezoelectric body layer; and
    a plurality of second through-hole conductors penetrating the second piezoelectric body layer, wherein;
    each of the plurality of second through-hole conductors is (1) directly connected to the second electrode and the third electrode and (2) surrounded by material of the second piezoelectric layer; and
    the plurality of first through-hole conductors and the plurality of second through-hole conductors are disposed in such a way as to be separated from each other when seen in the opposing direction.

3. The piezoelectric element according to claim 1, wherein a region demarcated by the plurality of first through-hole conductors has an n-gon shape when seen in the opposing direction, where n is an integer number equal to or larger than 4.

4. The piezoelectric element according to claim 1, wherein the first electrode and the second electrode have a same polarity.

5. The piezoelectric element according to claim 1, wherein the plurality of through-holes and the plurality of first through-hole conductors are each more than three.

6. The piezoelectric element according to claim 1, wherein:
    the piezoelectric body layer includes a region that includes the plurality of first through-hole conductors; and
    the region is not piezoelectrically active.

7. The piezoelectric element according to claim 1, wherein the first piezoelectric body layer includes an area sandwiched between the first electrode and the second electrode that is not piezoelectrically active.

8. The piezoelectric element according to claim 1, wherein the plurality of first through-hole conductors form a lattice when viewed in the opposing direction, with one of the plurality of first through-hole conductors being at each intersection of lines forming the lattice.

9. The piezoelectric element according to claim 8, wherein the lattice is a square lattice.

10. The piezoelectric element according to claim 1, wherein the each of the plurality of first through-hole conductors is an elongated conductor with an axis in the opposing direction.

* * * * *